United States Patent [19]

Takashima et al.

[11] Patent Number: 5,447,888
[45] Date of Patent: Sep. 5, 1995

[54] PROCESS OF EJECTING AN ENCAPSULATED SEMICONDUCTOR DEVICE FROM A MOLD BY DIRECTLY CONTACTING EXTERIOR LEADS WITH EJECTOR PINS

[75] Inventors: Akira Takashima; Toshiyuki Honda, both of Kawasaki; Masaki Waki, Kagoshima, all of Japan

[73] Assignees: Fujitsu Limited, Kawasaki; Kyushu Fujitsu Electronics Limited, Satsuma, both of Japan

[21] Appl. No.: 194,343

[22] Filed: Feb. 8, 1994

[30] Foreign Application Priority Data

Apr. 13, 1993 [JP] Japan .................................. 5-086489

[51] Int. Cl.6 .................... H01L 21/56; H01L 21/603; B29C 45/02
[52] U.S. Cl. .................................. 437/212; 437/217; 264/272.15; 264/272.17; 264/334
[58] Field of Search .................... 437/212; 264/272.15, 264/272.17, 334; 437/214, 217

[56] References Cited

U.S. PATENT DOCUMENTS

| 4,954,308 | 9/1990 | Yabe et al. | 264/272.17 |
| 5,133,921 | 7/1992 | Yokoyama | 264/272.15 |

FOREIGN PATENT DOCUMENTS 3-97248  4/1991  Japan .

*Primary Examiner*—Olik Chaudhuri
*Assistant Examiner*—David E. Graybill
*Attorney, Agent, or Firm*—Staas & Halsey

[57] ABSTRACT

A process wherein the parts of a lead frame that are outside a cavity are directly supported by ejecting pins extending from above and from below when the lead frame is sandwiched between an upper die and a lower die. The ejecting pins eject the lead frame, on which a package is formed, after a resin mold process.

5 Claims, 7 Drawing Sheets

PROCESS OF EJECTING AN ENCAPSULATED SEMICONDUCTOR DEVICE FROM A MOLD BY DIRECTLY CONTACTING EXTERIOR LEADS WITH EJECTOR PINS

BACKGROUND OF THE INVENTION

The present invention generally relates to fabrication of semiconductor devices and, more particularly, to a method of fabricating a resin-molded semiconductor package.

Recently, semiconductor devices have become more compact and thinner for increased mounting density. Conventional dual in-line packages (DIP) are being replaced by the small outline J-leaded (SOJ) packages or quad flat packages (QFPs). A new addition to the package types is a thin small outline package (TSOP), which is even smaller than the former two types. As a result of the reduced thickness, the rigidity of the packages has decreased, thus increasing the likelihood that a stage deformation occurs upon ejection of a molded package, and that a crack tends to develop in the package body due to vapor released at the time of the molding process.

Thus, there is a demand for a semiconductor device which is free from the problem of stage deformation and is resistant to thermal stress, such that development of cracks does not occur in the package even when heat is applied at the time of molding.

FIG. 1 is a cross sectional view of a conventional semiconductor device. Referring to FIG. 1, a semiconductor device 11 is configured such that a semiconductor chip 12 is mounted on a stage 13a defined on a lead frame 13 by a die attachment process, wherein the semiconductor chip 12 and a lead 13b are connected electrically with each other by bonding wires 14. Further, by molding the structure that includes the semiconductor chip 12 held on the lead frame 13 in a suitable die, a resin package body 15 is formed to encapsulate the chip 12.

In such a molding process, it is necessary to eject the semiconductor device from the die by a suitable mechanism such as an ejection pin, after the molding is completed. Thereby, it is inevitable that ejection marks 15a-15d are formed on the top and bottom of the package body 15.

FIGS. 2(A) and 2(B) describe how an ejection is performed in a conventional molding process. Referring to FIG. 2(A), the lead frame 13, on which the semiconductor device 12 is mounted by a die attachment process and is wire-bonded with the lead 13b, is placed inside a cavity formed by an upper die 16 and a lower die 17 before a resin mold process is carried out. The upper die 16 is provided with movable pins 18a and 18b so as to bear upon the top surface of the package 15; the lower die 17 is provided with movable pins 19a and 19b so as to bear upon the underside of the package 15.

When the upper die 16 and the lower die 17 are separated from each other after the resin mold process, the movable pins 18a, 18b, 19a and 19b are moved so that the lead frame 13 is ejected out of the upper and lower dies 16 and 17. Therefore, as shown in FIG. 2(B) and FIG. 1, the ejection marks 15a-15d, which are depressions created by the movable pins 18a, 18b, 19a and 19b and have a maximum depth of, for example, 100 μm, are formed on the top surface and the underside of the package 15. The underside of the package is not shown in FIG. 2(B). In such a package structure, it will be noted that the package 15 has a reduced thickness by a maximum of 200 μm at the ejection marks 15a-15d on the top surface and the underside thereof.

The semiconductor device 11 fabricated in the process as described has a drawback in that, as the package 15 gets thinner and, consequently, the semiconductor chip 12 occupies a greater proportion of the space in the package body 15, fluidity of the mold resin becomes poor during the molding process due to restricted space in the mold cavity, thereby causing deformation of the stage 13a and of the wires 14.

It will be noted that the movable pins 18a, 18b, 19a and 19b, which form the ejection marks 15a-15d on the package 15, cause a decrease in the flow of the mold resin, and that a large amount of deformation of the stage or of the wires may result in the wires 14 being exposed through the ejection marks 15a-15d.

Such a deformation of the stage and of the wires may be achieved by increasing the flow of the mold resin, which can in turn be achieved through a reduction in the viscosity of the resin used for the molding. Typically, this is achieved by reducing the percentage of a flexibility enhancer, such as oil, in the mold resin or by reducing the percentage of filler such as silica, in the mold resin.

It is also to be noted that, in the abovedescribed semiconductor device, the resin package body absorbs moisture in the air when it is left exposed at the room temperature, and this moisture turns into vapor when heat is applied during a mounting process of the semiconductor device. The pressure derived from this steam, when applied directly to the package, is great enough for cracks to develop at the corners of the package adjacent to the stage and at the corners of the chip. Consequently, deterioration in moisture resistance results.

Conventional approaches to prevent the package bodies from developing vapor-induced cracks include a process to improve the adhesion between the stage 13a and the mold resin; a process to improve the rigidity (modulus of elasticity) of the resin; and a process to lower the coefficient of moisture absorption of the package 15.

The approach to improve the adhesion includes formation of through holes in the stage 13a as well as formation of dimples or cruciform slits on the stage 13a such that the resin above the stage and the resin below the stage are connected with each other; and a method whereby the material of the mold resin and the lead frame is improved. The reduction of moisture absorption of the resin, on the other hand, can be achieved by improving the quality of the epoxy resin used for the molding or by a method for increasing the percentage of the filler in the resin.

The prevention of deformation of the stage is most effectively achieved by the reduction of the percentage of the filler in the resin. On the other hand, the prevention of the package cracks is most effectively achieved by increasing the percentage of the filler in the resin. It should be noted that the alternative approach, to apply work on the stage 13a for preventing the package cracks, is costly and has a drawback in that the die attachment of the chip is difficult to perform.

Hence, there is a problem in that the above-mentioned two demands—that is, the reduction of the percentage of the filler for the purpose of preventing the deformation of the stage, and the increase of the percentage of the filler for the purpose of preventing package cracks—contradict each other, and, therefore, it is impossible to meet both these requirements.

SUMMARY OF THE INVENTION

Accordingly, it is a general object of the present invention to provide a method of fabricating a semiconductor device wherein the foregoing problems are eliminated.

Another and more specific object of the present invention is to provide a method of fabricating a semiconductor device, as well as a fabricated semiconductor device, wherein the problem of deformation of the stage and the problem of package cracks are effectively eliminated when taking out the semiconductor device from a mold upon completion of a molding process therein.

Another object of the present invention is to provide a method of fabricating a semiconductor device comprising the steps of:

mounting a semiconductor chip on a stage defined on a conductor medium;

bonding terminal pads on said semiconductor chip to inner leads provided on said conductor medium by a conductor wire;

placing said conductor medium carrying thereon said semiconductor chip in a cavity created by a movable upper die and a movable lower die, such that said conductor medium is supported by means of movable ejecting means both from the upper side and from the lower side, said movable ejecting means being held movably on said upper and lower dies;

filling said cavity with a molten resin;

separating said upper die and said lower die from each other; and ejecting said conductor medium by actuating said ejecting members.

According to the present invention, the path of the molten resin in the cavity is not restricted and the problem of deformation of the stage or bonding wire, caused as a result of the poor flow of the molten resin, is successfully minimized. Further, the package thus obtained has an excellent rigidity or modulus of elasticity associated with the use of the resin that contains a large proportion of fillers. As a result, the problem of cracks of the package body is successfully eliminated.

Other objects and further features of the present invention will become apparent from the following detailed description when read in conjunction with the attached drawings.

DESCRIPTION OF THE PREFERRED EMBODIMENTS

Figure 3A:
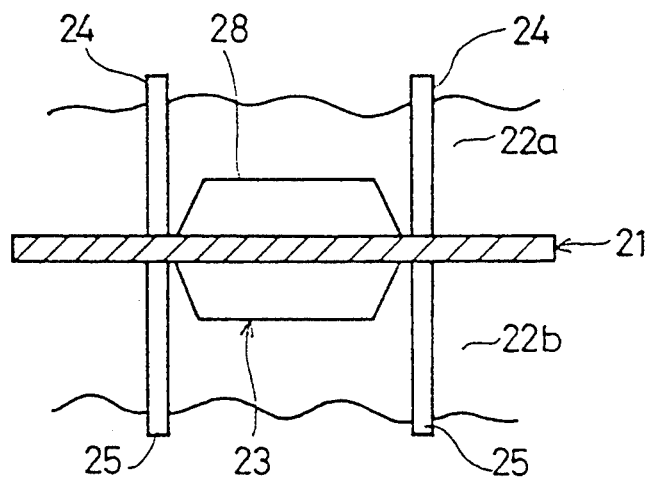
FIGS. 3(A)-3(C) are diagrams showing the principle of the present invention.
Figure 3B:
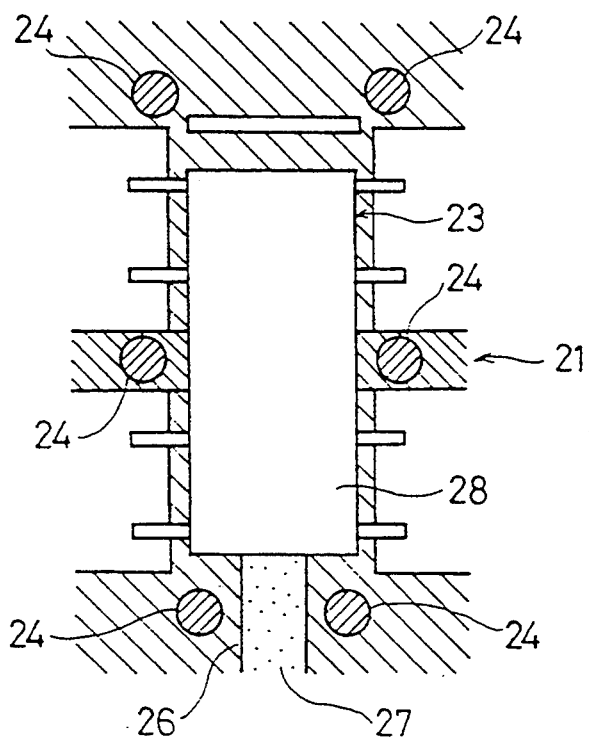
Figure 3C:
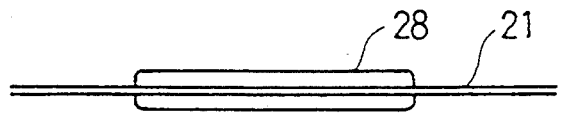

FIGS. 3(A)-3(C) show the principle of the present invention. Referring to FIGS. 3(A)-3(C), a semiconductor chip is mounted on a stage of a lead frame 21 of a conducting metal material (metal conductor), and the semiconductor chip is wire-bonded with inner leads of the lead frame 21 (see FIG. 5(A)). The semiconductor chip is placed inside a cavity 23, formed between a movable upper die 22a and a movable lower die 22b, and those parts of the lead frame 21 that are outside the cavity 23 are supported by a predetermined number of movable ejecting pins 24 and 25 (ejecting members), the ejecting pins 24 being provided in the upper die 22a, and the ejecting pins 25 being provided in the lower die 22b. FIG. 3(B) is a top view showing locations at which the lead frame 21 is supported by the ejecting pins. In FIG. 3(B), the numeral 26 indicates a gate through which a mold resin 27 is injected.

After a package 28 is obtained by filling the cavity 23 with the mold resin 27, the upper die 22a and the lower die 22b are separated from each other, and the ejecting pins 24 and 25 eject the lead frame 21.

In accordance with the present invention, as shown in FIGS. 3(A) and 3(B), those parts of the lead frame 21 that are outside the cavity 23 are supported by the ejecting pins 24 and 25 when the lead frame 21 is sandwiched between the upper die 22a and the lower die 22b, the pins 24 extending from above and the pins 25 extending from below. The ejecting pins 24 and 25 eject the lead frame 21, on which the package 28 is formed, after the resin mold process.

That is, the present invention has a benefit in that there are no ejection marks formed on the package 28 because not the package 28 but the lead frame 21 is ejected.

Therefore, the flowability of the mold resin does not become poor even when the package 28 is compact and a relatively large percentage of filler is contained in the mold resin 27. It is thus possible to prevent the deformation of the stage and the wires in a mold process, and to prevent package cracks from developing during a heating process after the package is fabricated.

Figure 4:
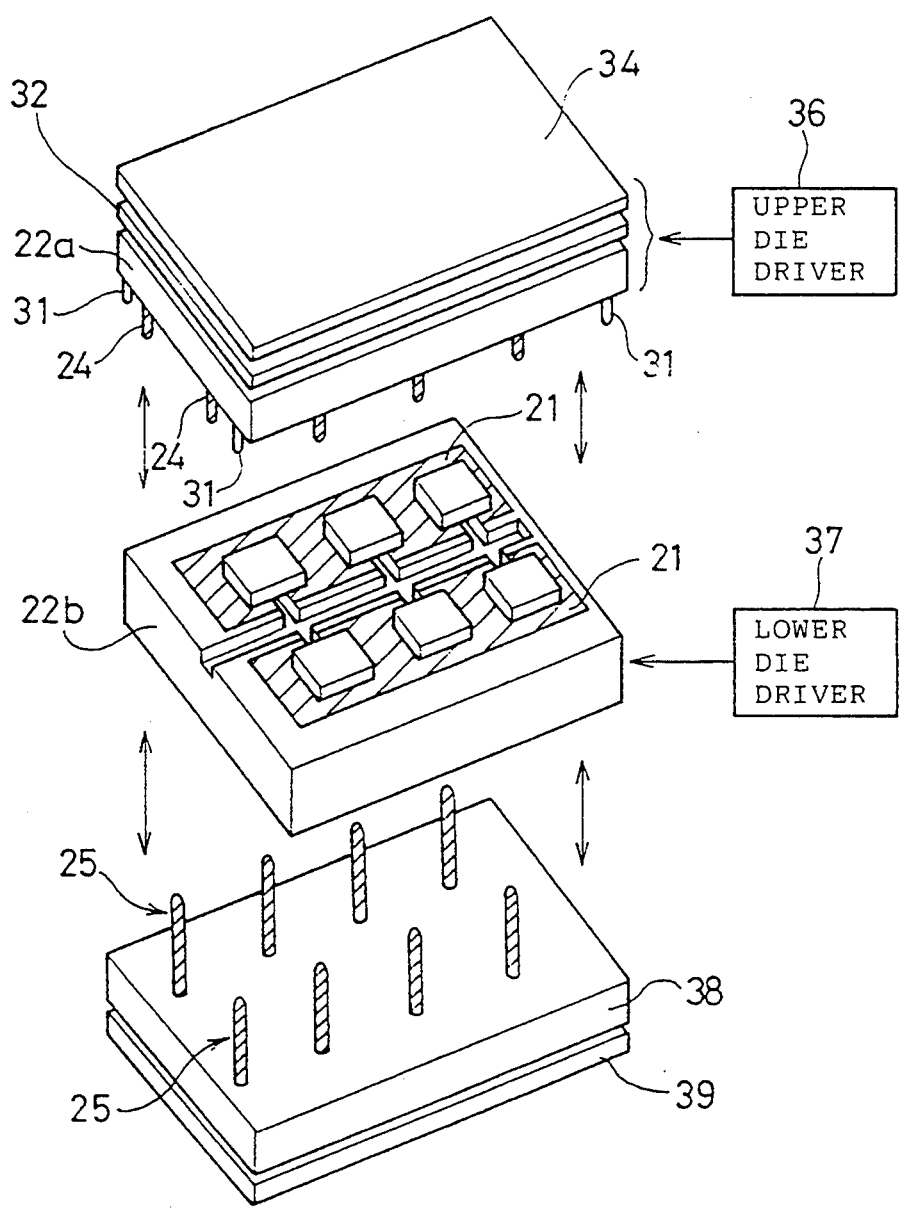
FIG. 4 is a diagram showing the constitution of an embodiment of the present invention.

FIG. 4 shows the constitution of an embodiment of the present invention. Referring to FIG. 4, the upper die 22a is provided with a pin plate 32 on which a predetermined number of pins 31 and ejecting pins 24 (ejecting members) are disposed upright. The upper die 22a is also provided with a plate 34 coupled to the pin plate 32 via a predetermined number of springs 33 (see FIGS. 7(A)-7(C)). The pins 31 are provided at the four corners of the pin plate 32, and the ejecting pins 24 are provided to correspond to those predetermined positions on the lead frame 21 that are near, but outside, the cavity 23 as described later.

The upper die 22a is provided with through holes (not shown) which accept the pins 31 and the ejecting pins 24. The pins 31 and the ejecting pins 24 are movable inside the through holes (see the description below given with reference to FIGS. 7(A)-7(C)). The upper die 22a, the pin plate 32 and the plate 34 are vertically movable by means of an upper die driver 36.

The lower die 22b supports the lead frame 21 embodying a metal conductor and carrying resin-molded semiconductor chips (see the description below given with reference to FIGS. 5(A) and 5(B)). The lower die 22b is vertically movable by means of a lower die driver 37. That is, the upper die 22a and the lower die 22b can be moved to approach each other. The upper die 22a and the lower die 22b form a chase block in which a cavity, a runner and a gate are formed.

Below the lower die 22b, there is provided a pin plate 38 on which a predetermined number of ejecting pins 25 are disposed upright, and a plate 39 is provided below the pin plate 38. The ejecting pins 25 disposed in the pin plate 38 are movable inside holes (not shown) formed in the lower die 22b such that the ejecting pins 25 correspond in position to respective ones of the ejecting pins 24 provided in the pin plate 32. The plate 39 is fixed, and the plate 38 is movable together with the lower die 22b.

Figure 5A:
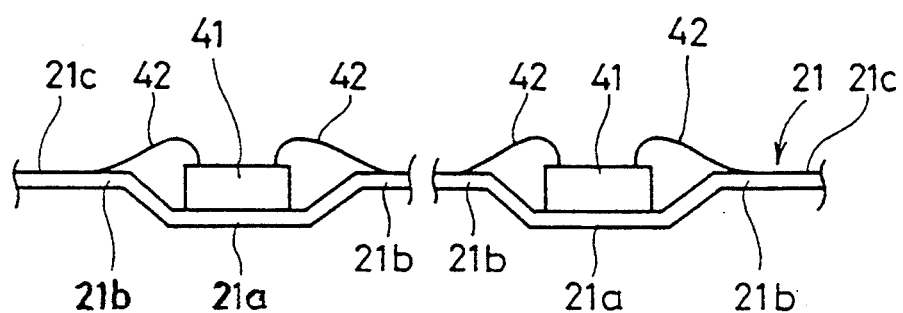
FIGS. 5 (A) and 5 (B) are diagrams showing elevational and perspective views of a lead frame before a molding process is performed.
Figure 5B:
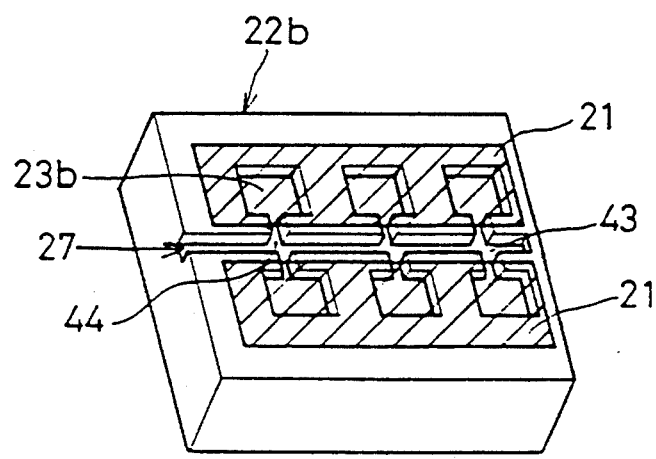

FIGS. 5(A) and 5(B) show how the lead frame 21 will look before the mold process is performed. Referring to FIG. 5(A), the lead frame 21 is configured such that a stage 21a, an inner lead 21b and an outer lead 21c are interconnected, the inner lead being adjacent to the stage 21a, and the outer lead 21c extending from and integrally formed with the inner lead 21b. A semiconductor chip 41 is mounted on the stage 21a by a die attachment process. Terminal pads of the semiconductor chip 41 and the inner lead 21b are bonded by wires 42.

FIG. 5(B) shows the lower die 22b, wherein a runner 43 is connected, through a respective gate 44, to a depression 23b that forms a part of the cavity 23. Since similar depressions for forming the other part of the cavity 23 are provided in the upper die 22a, the cavity 23 is created when the upper die 22a and the lower 22b are brought into face-to-face contact.

The upper die 22a is mounted on the lower die 22b such that the semiconductor chip 41, provided on the lead frame 21 as shown in FIG. 5(A), resides in the depression 23b of the lower die 22b. This will ensure that the semiconductor chip 41 and the vicinity thereof are accommodated in the cavity 23, which is created when the upper die 22a and the lower die 22b are brought into face-to-face contact. Thereafter, the mold resin is injected through the runner 43 so that the resin mold process is performed. The mold resin 27 used in this embodiment contains a relatively large percentage of filler, such as silica.

Figure 6A:
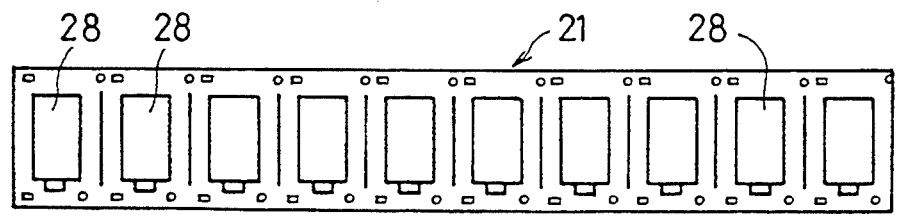
FIGS. 6(A)-6(C) are diagrams showing to differing views of a lead frame after the mold process is performed.
Figure 6B:
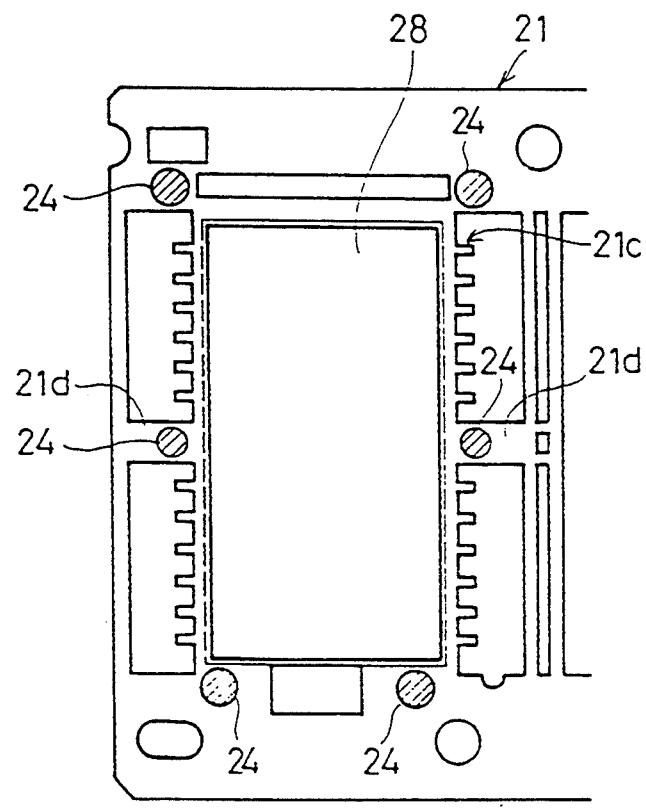
Figure 6C:
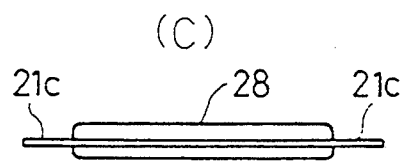

FIGS. 6(A) and 6(B) show how the lead frame 21 of the present invention looks after the mold process. FIG. 6(A) is an overall top view; FIG. 6(B) is an enlarged view of a portion of FIG. 6(A); and FIG. 6(C) is a side view of FIG. 6(B).

As shown in FIG. 6(A), a series of packages 28 is formed on the lead frame 21 by the resin mold process. While in a state in which the lead frame 21 is held between the upper die 22a and the lower die 22b, as indicated in FIG. 4, the lead frame 21 is supported by the ejecting pins 24 disposed in the vicinity of the cavity 23 (see FIG. 6(B)), that is, in the vicinity of the package 28, and by the ejecting pins 25 (not shown in FIG. 6(B)), each of the ejecting pins 25 being directly opposite to a respective one of the ejecting pins 24 across the lead frame 21. The positions of the pins 24 are indicated by hatched circles in FIG. 6(B). The lead frame 21 is ejected by the ejecting pins 24 and 25 after the resin mold process. Since the lead frame 21 is supported by the ejecting pins 24 and 25, the package 28 obtained as a result of the resin mold process is left free of ejection marks, as shown in FIG. 6(C).

FIG. 6(B) shows the lead frame 21 having a support bar 21d running through the center thereof. In the case of the lead frame that does not have the support bar 21d, the lead frame is supported by the ejecting pins 24 and 25 at the four corners of the package 28.

Each package 28 is then cut off from the lead frame 21, and each outer lead 21c is bent into a predetermined shape (for example, a J-shape or a gull wing shape). In this way, a semiconductor device is produced.

Figure 7A:
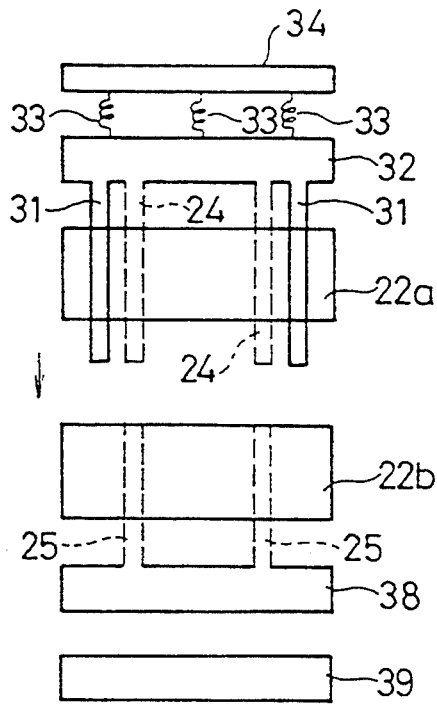
FIGS. 7(A)-7(C) are diagrams showing succesive stages of a fabrication process to obtain the constitution of FIG. 4.
Figure 7B:
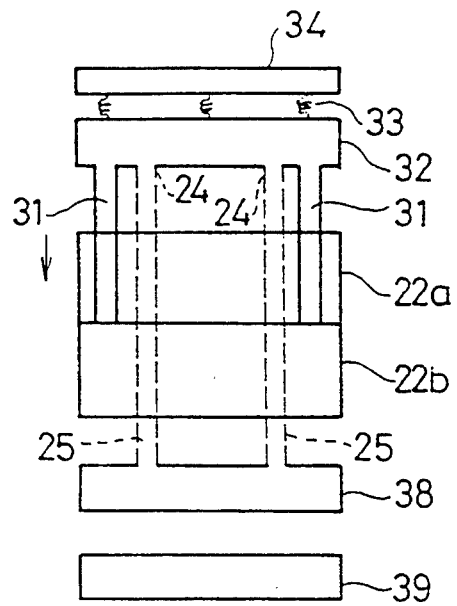
Figure 7C:
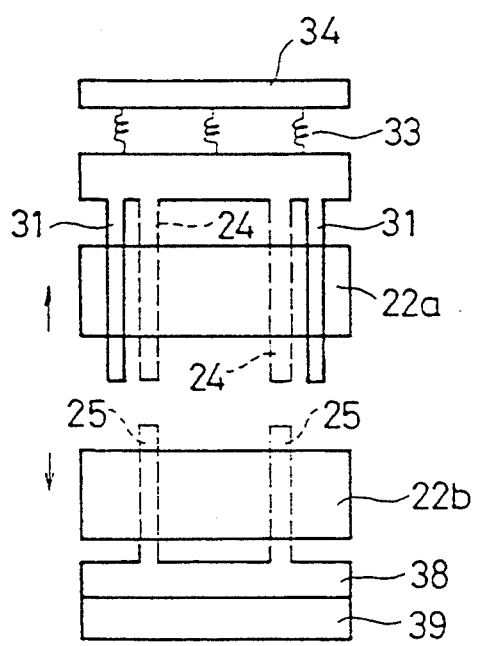

FIGS. 7(A)–7(C) show a fabrication process to obtain the constitution shown in FIG. 4. Referring to FIG. 7(A), the lower die 22b carries the lead frame 21 holding the semiconductor chips 41, which are attached to respective stages 21a by a die attachment process and which have the terminal pads thereof wire-bonded to the inner leads 21b. FIG. 7(A) shows a state in which the ejecting pins 25, disposed on the pin plate 38, do not project above the top surface of the lower die 22b, and the pin plate 38 and the plate 39 are separated from each other.

Conversely, the pin plate 32 is positioned such that the pins 31 and the ejecting pins 24 are urged by springs 33 so as to project through the plate 34 below the underside of the upper die 22a. The upper die 22a and the plate 34 are moved toward the lower die 22b by means of the upper die driver 36.

When, as shown in FIG. 7(B), the upper die 22a and the lower die 22b come into face-to-face contact with each other, the springs 33 contract and the ends of the pins 31 and the ejecting pins 24 on the pin plate 32 become flush with the underside of the upper die 22a. The function of the pins 31 is to make sure that the upper die 22a and the lower 22b are properly positioned with respect to each other. The ejecting pins 24 on the pin plate 32 and the ejecting pins 25 on the pin plate 38 support those positions of the lead frame 21 that are adjacent to the package 28 (the cavity 23), as shown in FIG. 7(B).

In this state, the mold resin 27 is injected into the runner 43 shown in FIG. 5(B) so that the resin mold process is performed in the cavity 23.

When the resin mold process is completed and the mold resin is cured after a predetermined period of time, the upper die 22a and the plate 34 are moved away from the lower die 22b by means of the upper die driver 36, as shown in FIG. 7(C), so that the upper die 22a is separated from the lower die 22b. The force of the springs 33 cause the pins 31 and the ejecting pins 24 to project through the underside of the upper die 22a. The ejecting pins 24 are thus able to eject the lead frame 21 out of the upper die 22a.

The lower die driver 37 moves the lower die 22b away from the upper die 22a, that is, toward the plate 39. When the lower die 22b continues to be moved in this direction even after the pin plate 38 comes into contact with the plate 39, the ejecting pins 25 project through the top surface of the lower die 22b. The ejecting pins 25 are thus able to eject the lead frame 21 out of the lower die 22b. The separation of the upper die 22a and the lower die 22b, and the ejection of the lead frame 21 out of the upper die 22a and the lower die 22b may be conducted substantially simultaneously.

Since it is those parts of the lead frame 21 adjacent to the package 28 that are ejected, the lead frame 21 is not deformed.

Since no ejection marks are created in the package 28, the mold resin 27 can contain a relatively large percentage of filler so as to prevent package cracks from developing when heat is applied during the mounting process. The absence of the ejection marks is beneficial in that the flowability of the mold resin is maintained so that deformation of the stage or of the wires is prevented. Hence, the margin of safety with respect to package cracks becomes satisfactorily large, and, consequently, the margin of safety with respect to the whole construction becomes satisfactorily large.

In accordance with the present invention, when a metal conductor is held between an upper die and a lower die, those parts of the metal conductor that are outside a cavity are supported by ejecting members from both sides, and the metal conductor is ejected by the ejecting members after a resin mold process. Consequently, deformation of a stage can be prevented from occurring in the mold process, and package cracks are prevented from developing in a mounting process.

Figure 8:
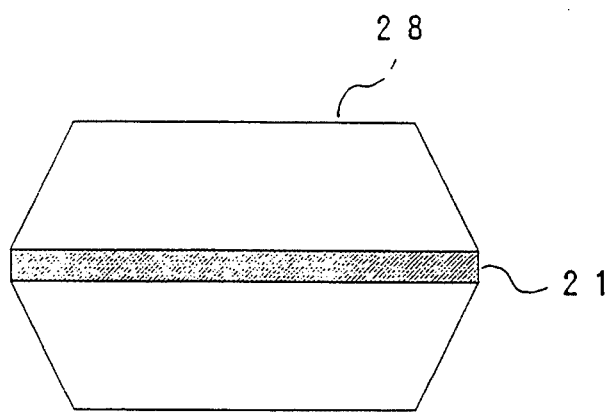
FIG. 8 is a view of the semiconductor package obtained according to the process of the present invention shown in FIG. 4.

FIG. 8 shows the semiconductor device package fabricated according to the process of the present invention by cutting off the laterally extending lead frame 21 from the device of FIG. 3(A). In FIG. 8, those parts that correspond to the part of FIG. 3(A) will be designated by the same reference numerals and the description thereof will be omitted.

Figure 1:
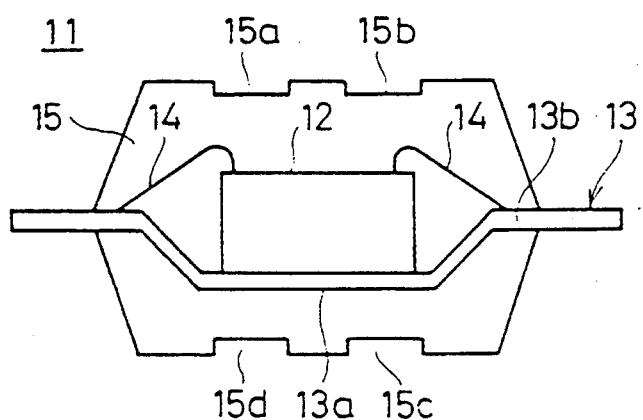
FIG. 1 is a cross sectional view of a conventional semiconductor package.
Figure 2A:
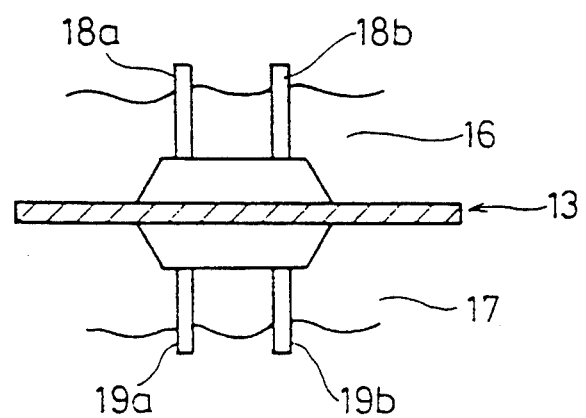
FIGS. 2(A) and 2(B) are diagrams showing the ejection performed in the conventional fabrication process of a semiconductor package.
Figure 2B:
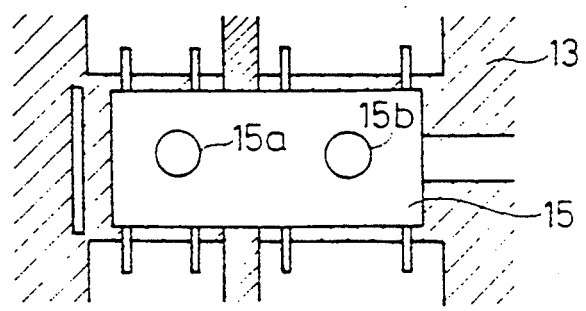

Referring to FIG. 8, it will be noted that the semiconductor device package 28 has substantially flat upper and lower major surfaces free from dimples that are formed in the device of FIGS. 2(A) and 2(B). More specifically, any projections or depressions formed on the upper and lower major surfaces of the package body 28 has a height or depth that is substantially smaller than 200 μm. Thereby, the path of the molten resin in the cavity is not restricted, and the problem of deformation of the stage or bonding wire, caused as a result of the poor flow of the molten resin, is successfully minimized. Further, the package thus obtained has an excellent rigidity or modulus of elasticity associated with the use of the resin that contains a large proportion of fillers. As a result, the problem of cracks of the package body is successfully eliminated. In the structure of FIG. 8, the those portions of the lead frame 21 extending beyond the package body 28 is cut off, and the lead frame 21 is exposed at the side wall of the body 28.

The present invention is not limited to the above described embodiments, and variations and modifications may be made without departing from the scope of the present invention.

What is claimed is:

1. A method of fabricating a semiconductor device comprising the steps of:
   mounting a semiconductor chip on a stage defined on a conductor medium;
   bonding terminal pads on said semiconductor chip to inner leads provided on said conductor medium by a conductor wire;
   placing said conductor medium, carrying said semiconductor chip on said stage thereof, such that said stage and said semiconductor chip are disposed in a cavity created by a movable upper die and a movable lower die, with portions of said conductor medium extending, laterally, outwardly from said cavity and such that said conductor medium is supported in said laterally, outwardly extending portions thereof by respective ejectors which are movably held in said upper and lower dies and extend therefrom toward and into engagement with the laterally, outwardly extending portions of said conductor medium, respectively on upper and lower sides thereof;
   filling said cavity with a molten resin;
   separating said upper die and said lower die from each other; and
   ejecting said conductor medium by actuating said ejecting members.

2. A method of fabricating a semiconductor device as claimed in claim 1, wherein said step of separating said upper die and said lower die from each other is conducted substantially simultaneously with said step of ejecting said conductor medium from said upper die and said lower die.

3. A method of fabricating a semiconductor device as claimed in claim 1, wherein said ejecting means comprises pins that are movably received in corresponding through holes provided in said upper die and said lower die.

4. A method of fabricating a semiconductor device as claimed in claim 1, wherein said step of placing is conducted such that said ejecting means support those portions of said conductor medium that are located outside said cavity.

5. A method of fabricating a semiconductor device as claimed in claim 1, wherein said upper die and said lower die can be moved to approach each other, and said step of ejecting is carried out such that said ejecting means provided on said lower die lifts up said conductor medium from said lower die after said lower die is moved away from said upper die.

* * * * *

UNITED STATES PATENT AND TRADEMARK OFFICE
CERTIFICATE OF CORRECTION

PATENT NO.    : 5,447,888
DATED         : September 5, 1995
INVENTOR(S)   : Akira TAKASHIMA, et al.

It is certified that error appears in the above-indentified patent and that said Letters Patent is hereby corrected as shown below:

On the title page, items:

[54] TITLE, change title to --METHOD OF FABRICATING A SEMICONDUCTOR DEVICE PACKAGE--;

[75] INVENTORS, change third inventor's address to --Satsuma--;

[57] ABSTRACT, change "A process wherein the" to --Those--;

Column 2, line 24, change "filler" to --filler,--;

Column 3, line 66, delete "to";

Column 7, line 48, delete "the" (second occurrence).

Signed and Sealed this

Twenty-first Day of May, 1996

Attest:

BRUCE LEHMAN

*Attesting Officer*          *Commissioner of Patents and Trademarks*